United States Patent
Harkness, IV et al.

(10) Patent No.: US 8,975,513 B2
(45) Date of Patent: Mar. 10, 2015

(54) QUANTUM DOT-SENSITIZED WIDE BANDGAP SEMICONDUCTOR HETEROJUNCTION PHOTOVOLTAIC DEVICES

(75) Inventors: Samuel D. Harkness, IV, Berkeley, CA (US); Hans J. Richter, Palo Alto, CA (US)

(73) Assignee: Seagate Technology LLC, Cupertino, CA (US)

( * ) Notice: Subject to any disclaimer, the term of this patent is extended or adjusted under 35 U.S.C. 154(b) by 110 days.

(21) Appl. No.: 13/171,356

(22) Filed: Jun. 28, 2011

(65) Prior Publication Data

US 2012/0003773 A1  Jan. 5, 2012

Related U.S. Application Data

(63) Continuation of application No. 11/713,652, filed on Mar. 5, 2007, now Pat. No. 7,968,792.

(51) Int. Cl.
| | |
|---|---|
| *H01L 31/032* | (2006.01) |
| *H01L 31/0352* | (2006.01) |
| *H01L 31/06* | (2012.01) |

(52) U.S. Cl.
CPC ........ *H01L 31/0352* (2013.01); *H01L 31/0324* (2013.01); *H01L 31/06* (2013.01); *Y02E 10/50* (2013.01)
USPC .............. 136/265; 136/258; 438/95

(58) Field of Classification Search
USPC ............... 136/243–265; 438/57–98; 257/431, 257/436, 465
See application file for complete search history.

(56) References Cited

U.S. PATENT DOCUMENTS

| | | | | |
|---|---|---|---|---|
| 8,029,924 | B2 * | 10/2011 | Harkness et al. | 428/831 |
| 2007/0298590 | A1 * | 12/2007 | Choi et al. | 438/478 |
| 2008/0092946 | A1 * | 4/2008 | Munteanu et al. | 136/252 |

OTHER PUBLICATIONS

Munteanu et al., U.S. Appl. No. 60/854,226 (2006).*
Munteanu et al., U.S. Appl. No. 60/857,967 (2006).*
Munteanu et al., U.S. Appl. No. 60/859,593 (2006).*
Lazzeri et al., Structure and Energetics of Stochiometric TiO2 Anatase Surfaces, Physical Review B, vol. 63, 155409, pp. 1-9, (2001).*
Chang-Hui et al., Optical Properties of Self-Organized PbS Quantum Dot Superlattices, Chinese Phys. Lett., vol. 17, No. 10, pp. 755-756 (2000).*
The Free Dictionary, http://www.thefreedictionary.com/honeycomb, downloaded Jul. 24, 2014.*

* cited by examiner

*Primary Examiner* — Jayne Mershon

(57) ABSTRACT

A quantum dot (QD) sensitized wide bandgap (WBG) semiconductor heterojunction photovoltaic (PV) device comprises an electron conductive layer; an active photovoltaic (PV) layer adjacent the electron conductive layer; a hole conductive layer adjacent the active PV layer; and an electrode layer adjacent the hole conductive layer. The active PV layer comprises a wide bandgap (WBG) semiconductor material with $E_g \geq 2.0$ eV, in the form of a 2-dimensional matrix defining at least two open spaces, and a narrower bandgap semiconductor material with $E_g < 2.0$ eV, in the form of quantum dots (QD's) filling each open space defined by the matrix of WBG semiconductor material and establishing a heterojunction therewith. The active PV layer is preferably fabricated by a co-sputter deposition process, and the QD's constitute from about 40 to about 90 vol. % of the active PV layer.

36 Claims, 6 Drawing Sheets

QUANTUM DOT-SENSITIZED WIDE BANDGAP SEMICONDUCTOR HETEROJUNCTION PHOTOVOLTAIC DEVICES

CROSS-REFERENCES TO RELATED APPLICATIONS

This application is a continuation of U.S. patent application Ser. No. 11/713,652, filed on Mar. 5, 2007, now U.S. Pat. No. 7,968,792, which is hereby incorporated herein by reference in its entirety.

FIELD OF THE INVENTION

The present invention relates to improved quantum dot sensitized wide bandgap semiconductor photovoltaic devices and methods for fabricating same. The invention has particular utility in the manufacture and use of photovoltaic solar cells for direct conversion of radiant to electrical energy.

BACKGROUND OF THE INVENTION

A recently developed class of photovoltaic ("PV") cells and devices, sometimes referred to as "Graetzel Cells" (see, e.g., U.S. Pat. Nos. 4,684,537; 5,350,644; 5,463,057; 5,525,440; and 6,278,056 B1), is based upon dye-sensitization of a wide bandgap ("WBG") semiconductor (i.e., $E_g \geq 2$ eV, preferably $\geq 3$ eV), such as $TiO_2$, for efficient injection of electrons into the conduction band upon photo-excitation of the dye molecules, followed by charge separation and photovoltage generation utilizing a liquid electrolyte for hole conduction. While such devices are attractive in terms of their inherent simplicity and use of environmentally stable WBG material, the relatively low absorption coefficients of the photodyes necessitates use of extremely thick "mesoscopic" $TiO_2$ films for adequate capture of incident photons. Disadvantageously, however, this results in greater opportunity for loss of excited electron-hole pairs ("excitons") due to recombination and thermalization. Consequently, the efficiency of solar conversion of such devices is generally limited to ~10%.

According to a variation of this approach, quantum dots ("QD's"), i.e., nano-dimensioned semiconductor particles that confine the motion of conduction band electrons, valence band holes, or pairs of conduction band electrons and valence band holes ("excitons") in all three spatial directions, are substituted for the abovementioned dye molecules (see, e.g., U.S. Pat. Nos. 6,861,722 B2 and 7,042,029 B2). Contact between porous $TiO_2$ films and the QD's, may for example, be accomplished via absorption, utilizing a porous $TiO_2$ body and a colloidal solution of the QD, or produced via an in situ process. PV effects have been observed with a number of semiconductor-based QD's, including InP, CdSe, CdS, and PbS. Advantages of QD's vis-à-vis dye molecules in solar PV applications involving sensitization of WBG's include better tunability of optical properties via size control of the QD particles and better heterojunction formation with solid, rather than liquid hole conductors.

As explained below, another advantageous capability of QD-sensitized PV cells is the production of quantum yields >1 by impact ionization, sometimes referred to as the "inverse Auger effect". Since the inverse Auger effect is not possible with dye-sensitized PV cells, much higher conversion efficiencies are possible with solid state heterojunction QD-sensitized PV cells.

Referring to FIG. 1, shown therein, in schematic form, is a band diagram for solid state heterojunction QD-sensitized PV cells, wherein: CB and VB respectively indicate the conduction band and valence band energies of the QD and WBG materials (illustratively PbS and $TiO_2$, respectively), $E_F$ represents the respective Fermi energy levels, and $\Phi_A$ indicates the respective electron affinities (work functions). In order for charge injection (sensitization) from the QD to the WBG material to occur, the difference between the work function $\Phi_A$ and conduction band energy CB must be greater for the WBG than for the QD.

Design rules for the materials selection process for fabricating solid state heterojunction QD-sensitized PV cells such as shown in FIG. 1 include:

1. the minimum size of the QD, i.e., $D_{min} = (\tau \hbar / 2m_e^* \Delta E_c)^{1/2}$, where $m_e^*$ is the effective mass of the electron, and $\Delta E_c$ is the difference between the energies of the CB's of the QD and WBG materials, wherein the bandgap energy $E_g$ of the WBG semiconductor material is $\geq 2.0$ eV, preferably $\geq 3.0$ eV; and the bandgap energy $E_g$ of the QD semiconductor material is <2.0 eV, preferably <1.0 eV; and 2. the exciton radius, $a_x$, is larger than the QD radius, where $a_x = \epsilon_r / M^* a_H$, wherein is the relative permittivity and $M^* = (M_e^* M_h^*)/(M_e^* M_h^*)$ and $M_e^*$ and $M_h^*$ denote the effective masses of the electrons and holes in units of the electron rest mass and $a_H$ is the Bohr radius of $5.29 \times 10^{-11}$ m. The QD radius $D_{min}$ ranges from about 3 to about 15 nm, and is typically about 5-9 nm.

The term "exciton radius" $a_x$ refers to the average physical separation between the electron and hole of the electron-hole pair within the semiconductor. If the size of the semiconductor particle, i.e., QD, is less than or equal to the exciton radius, quantum confinement occurs and the energy levels in the QD are discrete and continuous energy level bands are no longer formed. Typical values of $a_x$ range between about 2 and about 20 nm.

Adverting to FIG. 2, schematically illustrated therein is a band diagram for describing the increase in photon conversion efficiency afforded by QD's, wherein enhanced photocurrent is obtained when energetic ("hot") charge carriers (eV pairs or excitons) produce a second (or even a third, etc.) $e^- h^+$ pair or exciton via impact ionization, a process which is the inverse of an Auger recombination process wherein two $e^- h^+$ pairs recombine to form a single, highly energetic $e^- h^+$ pair. In order for the inverse Auger recombination process to result in increased photon conversion efficiency, the rate at which impact ionization occurs must be greater than the rate of carrier "cooling" and other relaxation processes for hot carriers.

Referring now to FIG. 3, schematically illustrated therein is a band diagram illustrating the mechanism of operation of a solid state heterojunction QD-sensitized PV cell comprising a layer of a WBG semiconductor material (i.e., $E_g > 2.0$ eV, preferably >3.0 eV), e.g., $TiO_2$, forming a heterojunction with a layer of a narrower bandgap QD semiconductor material (i.e., $E_g < 2.0$ eV, preferably <1.0 eV), e.g., PbS. The latter is contacted at an opposite interface with a hole conductor, e.g., a layer of a hole conductive semiconductor material. Respective contacts (output terminals) are formed on the $TiO_2$ and hole conductive semiconductor layers for obtaining an electrical output from the cell for supply to a load device. As shown in the figure, absorption of a photon in the QD results in formation of an energetic $e^- h^+$ pair (or exciton) in the QD, which $e^- h^+$ pair (or exciton) then produces a second $e^- h^+$ pair in the QD via impact ionization. Both excited electrons in the conduction band of the QD may then be efficiently transferred to the conduction band of the electron conductive WBG semiconductor, and thence to the negative output terminal. Hole transport occurs in the opposite direction via the valence bands of the QD and hole conductive semiconductor to the positive output terminal. FIGS. 4 (A) and 4 (B) schematically illustrate the directions of electron and hole travel, respectively, in the QD-sensitized PV cell of FIG. 3. As shown in FIG. 4 (A), if any portion of the QD is in interfacial contact with the negative output terminal, excited electrons present in the QD may also travel directly to the negative output terminal to produce photocurrent.

Notwithstanding the potential for increased photon conversion efficiency afforded by the solid state heterojunction QD-sensitized PV cells such as described above, the heretofore utilized manufacturing techniques comprising absorption of the QD material from solution onto a porous body of a WBG semiconductor material, as well as in situ processing, result in relatively low surface-to-volume ratios of the WBG semiconductor particles (e.g., $TiO_2$), which when combined with the relatively low coverage of the WBG particle surfaces with QD's, limits the actual performance and viability of such devices.

Accordingly, there exists a clear need for improved solid state heterojunction QD-sensitized PV cells capable of performing in optimal manner at high solar photon conversion efficiencies. Further, there exists a clear need for improved methodology for fabrication of such improved solid state heterojunction QD-sensitized PV cells in cost-effective manner utilizing readily available manufacturing instrumentalities and technologies.

DISCLOSURE OF THE INVENTION

An advantage of the present invention is an improved quantum dot (QD) sensitized wide bandgap (WBG) semiconductor heterojunction photovoltaic (PV) device.

Another advantage of the present invention is an improved quantum dot (QD) sensitized wide bandgap (WBG) semiconductor heterojunction photovoltaic (PV) device with an active PV layer having a substantially increased QD content.

Still another advantage of the present invention is an improved quantum dot (QD) sensitized wide bandgap (WBG) semiconductor heterojunction photovoltaic (PV) device with dual-sided irradiation capability.

Yet another advantage of the present invention is an improved method of fabricating quantum dot (QD) sensitized wide bandgap (WBG) semiconductor heterojunction photovoltaic (PV) devices.

A further advantage of the present invention is an improved method of fabricating quantum dot (QD) sensitized wide bandgap (WBG) semiconductor heterojunction photovoltaic (PV) devices with active PV layers having substantially increased QD content.

A still further advantage of the present invention is an improved method of fabricating quantum dot (QD) sensitized wide bandgap (WBG) semiconductor heterojunction photovoltaic (PV) devices with dual-sided irradiation capability.

These and additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to an aspect of the present invention, the foregoing and other advantages are obtained in part by an improved quantum dot (QD) sensitized wide bandgap (WBG) semiconductor heterojunction photovoltaic (PV) device, comprising:

a wide bandgap (WBG) semiconductor material with $E_g \geq 2.0$ eV, in the form of a 2-dimensional matrix defining at least two open spaces; and a narrower bandgap semiconductor material with $E_g < 2.0$ eV, in the form of quantum dots (QD's) filling the open spaces defined by the matrix of WBG semiconductor material and establishing a heterojunction therewith.

In accordance with embodiments of the present invention, the device further comprises an electron conductive layer adjacent a first side of the active PV layer; a hole conductive layer adjacent a second side of the active PV layer; and an electrode layer adjacent the hole conductive layer. Each QD is columnar- or grain-shaped and extends from the electron conductive layer to the hole conductive layer; the WBG and narrower bandgap semiconductor materials are immiscible; each QD is isolated by the matrix of WBG semiconductor material; the WBG semiconductor material has a bandgap $E_g \geq 3.0$ eV and is an electron conductive material selected from the group consisting of: $TiO_2$, $ZnS$, $ZnO$, $Ta_2O_5$, $Nb_2O_5$, and $SnO_2$; and the narrower bandgap semiconductor material has a bandgap $E_g < 1.0$ eV and is selected from the group consisting of: $PbS$, $InP$, $InAs$, $CdS$, $CdSe$, $CdTe$, $Bi_2S_3$, and $AlSb$.

Another aspect of the present invention is an improved quantum dot (QD) sensitized wide bandgap (WBG) semiconductor heterojunction photovoltaic (PV) device, comprising:

(a) an electron conductive layer;
(b) an active photovoltaic (PV) layer adjacent the electron conductive layer;
(c) a hole conductive layer adjacent the active PV layer; and
(d) an electrode layer adjacent the hole conductive layer; wherein the active PV layer comprises:
  (i) a wide bandgap (WBG) semiconductor material with $E_g > 2.0$ eV, in the form of a 2-dimensional matrix defining at least two open spaces; and
  (ii) a narrower bandgap semiconductor material with $E_g < 2.0$ eV, in the form of quantum dots (QD's) filling the open spaces defined by the matrix of WBG semiconductor material and establishing a heterojunction therewith.

In accordance with embodiments of the present invention, the QD's constitute from about 40 to about 90 vol. % of the active PV layer, typically about 70 vol. % of the active PV layer; each QD is columnar- or grain-shaped and extends from the electron conductive layer to the hole conductive layer; the WBG and narrower bandgap semiconductor materials are immiscible; and each QD is isolated by the matrix of WBG semiconductor material.

According to the present invention, each columnar- or grain-shaped QD has a physical dimension within the range from about 2 to about 10 nm for exhibiting quantum containment effects; and the active PV layer is from about 2 to about 20 nm thick, preferably from about 2 to about 10 nm thick.

Preferably, the WBG semiconductor material has a bandgap $E_g \geq 3.0$ eV; and the narrower bandgap semiconductor material has a bandgap $E_g < 1.0$ eV.

According to embodiments of the present invention, the WBG semiconductor material is an electron conductive material selected from the group consisting of: $TiO_2$, $ZnS$, $ZnO$, $Ta_2O_5$, $Nb_2O_5$, and $SnO_2$; and the narrower bandgap semiconductor material is selected from the group consisting of: $PbS$, $InP$, $InAs$, $CdS$, $CdSe$, $CdTe$, $Bi_2S_3$, and $AlSb$. Preferably, the WBG semiconductor material is anatase $TiO_2$; and the narrower bandgap semiconductor material is $PbS$.

In accordance with embodiments of the present invention, the electron conductive layer is comprised of an n-type semiconductor material, and is preferably transparent and formed over a surface of a transparent substrate.

According to preferred embodiments of the present invention, the n-type semiconductor material comprises a layer of a transparent conductive oxide (TCO) material selected from the group consisting of: $SnO_2$:F, ZnO, $SrRuO_3$, $In_2O_3$—$SnO_2$ (ITO), and $CdSnO_4$, the layer comprising a granular, nano-textured surface in direct, preferably epitaxial, contact with the active PV layer.

In accordance with embodiments of the present invention, adhesion and seed layers are present intermediate the surface of the transparent substrate and the TCO layer; the adhesion layer comprising at least one material selected from the group consisting of: Ti, Ta, CrTa, and CrTi; and the seed layer comprising at least one material selected from the group consisting of: Al, Au, Ag, Pt, Pd, Cu, Ni, Rh, Ru, Co, Re, and Ti. Preferably, the adhesion layer comprises Ti and the seed layer comprises Au.

According to embodiments of the present invention, the hole conductive layer comprises a semiconductor material ("SC") wherein $(\Phi_A\text{-VB})_{SC} > (\Phi_A\text{-VB})_{QD}$, e.g., Si, p-Si, GaAs, or p-GaAs; and the electrode layer is comprised of an electrically conductive material selected from the group consisting of: Hf, Au, Ni, Al, Cu, Pt, Pd, and TCO materials. Preferably, each of the electron conductive and electrode layers is light transmissive, whereby the device is operable via irradiation of either or both light transmissive layers.

In accordance with embodiments of the present invention, the device further comprises:
(e) electrical contacts to each of the electron conductive and electrode layers.

Another aspect of the present invention is an improved method of fabricating a quantum dot (QD) sensitized wide bandgap (WBG) semiconductor heterojunction photovoltaic (PV) device, comprising steps of:
(a) providing an electron conductive layer;
(b) forming an active photovoltaic (PV) layer in contact with the electron conductive layer;
(c) forming a hole conductive layer in contact with the active PV layer; and
(d) forming an electrode layer in contact with the hole conductive layer;
wherein step (b) comprises:
(i) providing a wide bandgap (WBG) semiconductor material with $E_g \geq 2.0$ eV;
(ii) providing a narrower bandgap semiconductor material with $E_g < 2.0$ eV; and
(iii) forming a 2-dimensional matrix comprising the WBG material, the matrix defining a plurality of open spaces; and
(iv) filling the open spaces defined by said matrix of WBG semiconductor material with quantum dots (QD's) of the narrower bandgap semiconductor material, the narrower bandgap and WBG semiconductor materials forming a heterojunction therebetween.

In accordance with embodiments of the present invention, steps (b)(iii) and (b)(iv) occur substantially simultaneously and each comprise a physical vapor deposition (PVD) process. Preferably, steps (b)(iii) and (b)(iv) are performed substantially simultaneously by co-sputter deposition of the narrower bandgap and WBG semiconductor materials.

According to preferred embodiments of the present invention, steps (b)(iii) and (b)(iv) are performed according to process conditions typical of Zone 1 of a Thornton diagram and include low to moderate substrate temperatures of about 200° C. and relatively high sputter gas pressures >20 mTorr of inert gas. Steps (b)(iii) and (b)(iv) may further comprise addition of at least one gas comprising at least one constituent element of the narrower bandgap and WBG semiconductor materials.

In accordance with embodiments of the present invention, the QD's constitute from about 40 to about 90 vol. % of the active PV layer formed in step (b), typically about 70 vol. %.

Preferably, steps (b)(i) and (b)(ii) comprise providing immiscible WBG and narrower bandgap semiconductor materials; steps (b)(iii) and (b)(iv) form columnar- or grain-shaped QD's which extend from the electron conductive layer to the hole conductive layer, each QD being isolated by the matrix of WBG semiconductor material; and each columnar- or grain-shaped QD formed in steps (b)(iii) and (b)(iv) has a physical dimension within the range from about 2 to about 10 nm for exhibiting quantum containment effects.

According to embodiments of the present invention, the active PV layer formed in steps (b)(iii) and (b)(iv) is from about 2 to about 20 nm thick, preferably from about 2 to about 10 nm thick; step (b)(i) preferably comprises providing a WBG semiconductor material having a bandgap $E_g \geq 3.0$ eV; and step (b)(ii) preferably comprises providing a narrower bandgap semiconductor material having a bandgap $E_g < 1.0$ eV.

Embodiments of the present invention include those wherein step (b)(i) comprises providing a WBG semiconductor material as an electron conductive material selected from the group consisting of: $TiO_2$, ZnS, ZnO, $Ta_2O_5$, $Nb_2O_5$, and $SnO_2$; and step (b)(ii) comprises providing a narrower bandgap semiconductor material selected from the group consisting of: PbS, InP, InAs, CdS, CdSe, CdTe, $Bi_2S_3$, and AlSb. Preferably, step (b)(i) comprises providing anatase $TiO_2$ as the WBG semiconductor material; and step (b)(ii) comprises providing PbS as the narrower bandgap semiconductor material.

In accordance with embodiments of the present invention, step (a) comprises providing an electron conductive layer comprised of an n-type semiconductor material. Preferably, step (a) comprises providing a transparent n-type semiconductor layer formed over a surface of a transparent substrate. E.g., step (a) comprises providing the n-type semiconductor material as a layer of a transparent conductive oxide (TCO) material selected from the group consisting of: $SnO_2$:F, ZnO, $SrRuO_3$, $In_2O_3$—$SnO_2$ (ITO), and $CdSnO_4$, wherein step (a) comprises providing the layer of TCO material with a granular, nano-textured surface; and step (b) comprises forming the active PV layer in direct contact with the layer of TCO material. Preferably, the interface between the active PV layer and the layer of TCO material is epitaxial.

Preferably, step (a) comprises forming the layer of TCO material by means of a 2-stage sputter deposition process comprising a first stage utilizing a low pressure sputtering atmosphere from about 1 to about 10 mTorr for deposition of an initial 2-90 nm thickness of the TCO layer, and a second stage utilizing a higher pressure sputtering atmosphere from about 10 to about 200 mTorr for deposition of the final 1-10 nm thickness of the TCO layer.

According to embodiments of the present invention, step (a) further comprises providing adhesion and seed layers intermediate the surface of the transparent substrate and the layer of TCO material; the adhesion layer comprises at least one material selected from the group consisting of: Ti, Ta, CrTa, and CrTi; and the seed layer comprises at least one material selected from the group consisting of: Al, Au, Ag, Pt, Pd, Cu, Ni, Rh, Ru, Co, Re, and Ti. Preferably, the adhesion layer comprises Ti and the seed layer comprises Au.

In accordance with embodiments of the present invention, step (c) comprises providing a hole conductive layer comprised of a semiconductor material ("SC"), wherein $(\Phi_A\text{-VB})_{SC} > (\Phi_A\text{-VB})_{QD}$, e.g., Si, p-Si, GaAs, or p-GaAs; and step (d) comprises providing an electrode comprised of an electrically conductive material selected from the group consisting of: Hf, Au, Ni, Al, Cu, Pt, Pd, and TCO materials.

Preferably, the electron conductive layer provided in step (a) and the electrode layer formed in step (d) are each light transmissive, whereby the device is operable via irradiation of either or both light transmissive layers.

According to embodiments of the present invention, the method further comprises:

(e) a step of forming electrical contacts to each of the electron conductive and electrode layers.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein.

DESCRIPTION OF THE INVENTION

The present invention is based upon recognition that solid-state heterojunction QD-sensitized PV cells can be fabricated with substantially improved viability when used as solar energy-to-electrical energy conversion devices than heretofore possible via conventional methodologies, including absorption of the QD material from colloidal solution and in situ processing. According to the present invention, the active photovoltaic layer of solid-state heterojunction QD-sensitized PV cells is a novel granular film structure comprising a columnar-shaped, 2-dimensional matrix including a substantially greater volume (hence amount) of QD material, relative to WBG material, than heretofore afforded by the aforementioned conventional methodologies, such as absorption of QD material from solution and in situ processing.

More specifically, according to the present invention, a substrate (preferably transparent) with an electrically conductive granular layer thereon (e.g., transparent conductive oxide, "TCO", such as an indium-tin oxide, "ITO", layer) having peaks and valleys and a desired crystallographic orientation is provided in an initial step, and in a subsequent step an active photovoltaic ("PV") layer comprising QD and WBG material is co-deposited thereon, e.g., by a physical vapor deposition (PVD) process such as sputtering. The QD's nucleate as precipitates filling the spaces in the 2-dimensional matrix of WBG material, with the volume fraction of the QD material in the active PV layer being in the range from about 40 to about 90 vol. %, typically about 70 vol. %.

According to the invention, the QD material is co-deposited with the immiscible WBG material, e.g., by sputter deposition utilizing separate targets or a composite target comprised of both materials, such that the QD material nucleates as a precipitate at the peaks of the electrically conductive ITO layer and forms columns (or grains) extending substantially orthogonally therefrom to a hole conductive layer, whereas the WBG material migrates to and segregates at the boundaries between adjacent columns (grains) of QD material. A film structure wherein QD material fills the spaces defined by a 2-dimensional matrix of WBG semiconductor material as a grain boundary segregant is thus formed, wherein the QD material occupies as much as 90 vol. % of the resultant film. The particles (columns) of QD material are well isolated, with dimensions in the nm range, i.e., consistent with the requirements for quantum confinement. The result is an active PV layer comprising a QD-sensitized WBG semiconductor material, including a sufficiently large area of QD-WBG contact, thereby well-suited for obtaining devices with enhanced PV conversion efficiencies via impact ionization (inverse Auger recombination), as described above.

Figure 1:
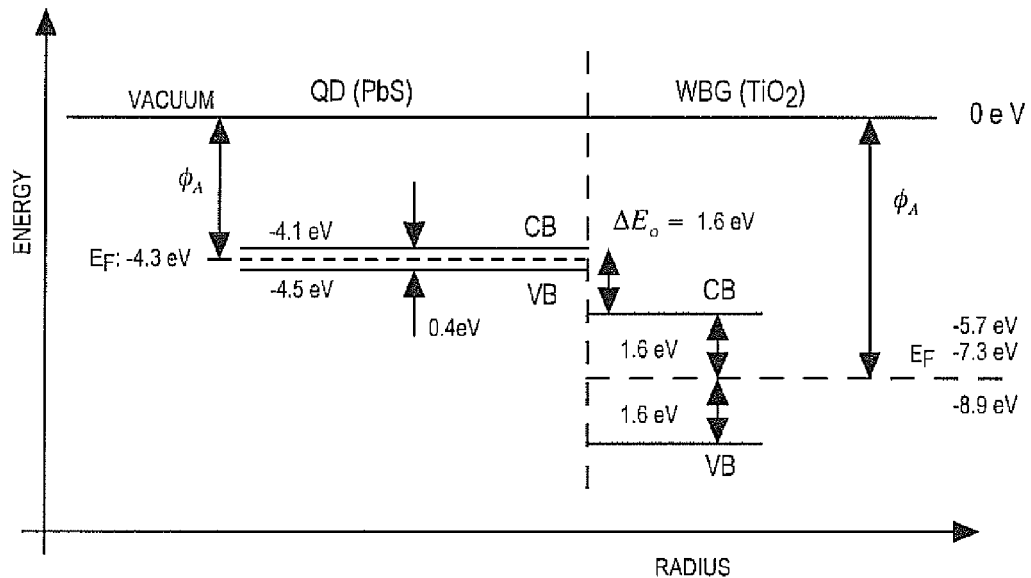
FIG. 1 is a band diagram schematically illustrating a solid-state heterojunction QD-sensitized PV cell.
Figure 2:
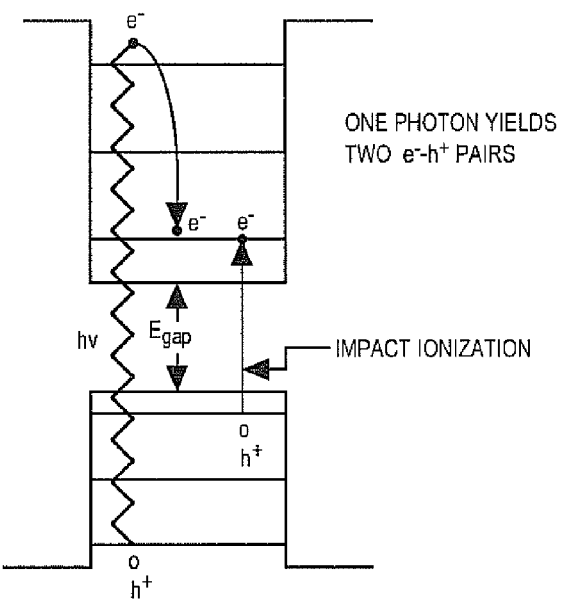
FIG. 2 is a band diagram schematically illustrating exciton generation in QD's via impact ionization (inverse Auger effect)
Figure 3:
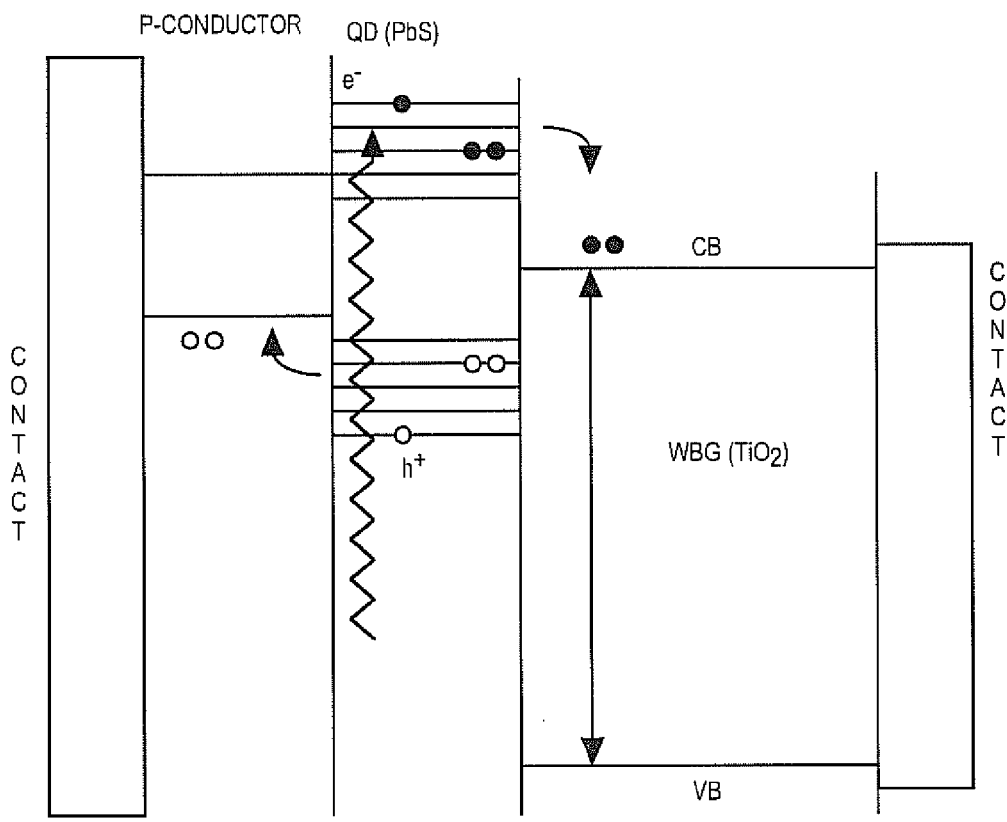
FIG. 3 is a band diagram schematically illustrating exciton generation in a solid-state heterojunction QD-sensitized PV cell.
Figure 4A:
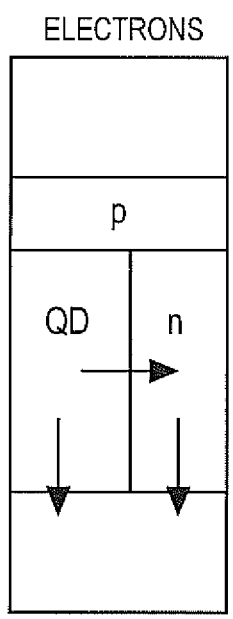
FIGS. 4 (A) and 4 (B) schematically illustrate the directions of electron and hole travel, respectively, in the QD-sensitized PV cell of FIG. 3.
Figure 4B:
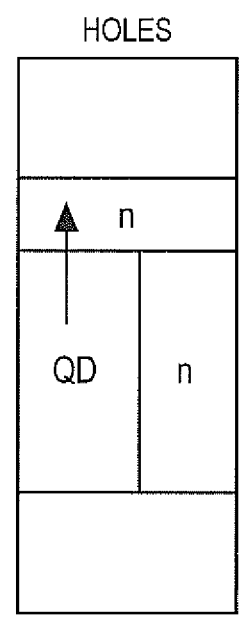
Figure 5:
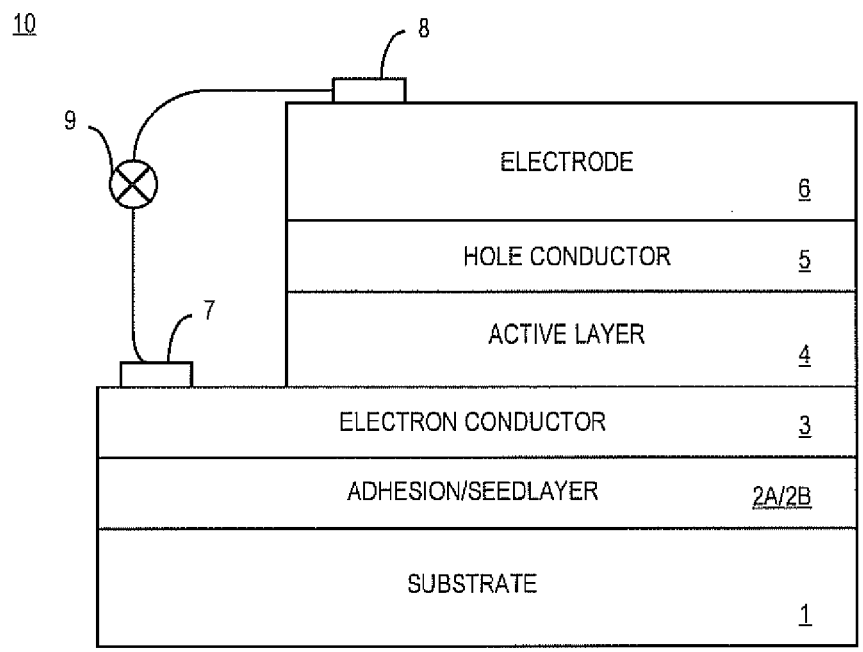
FIG. 5 is a simplified, schematic cross-sectional view of an illustrative, but non-limitative, embodiment of a solid-state heterojunction QD-sensitized PV cell according to the present invention.

Referring now to FIG. 5, shown therein is a simplified, schematic cross-sectional view of an illustrative, but non-limitative, embodiment of a solid-state heterojunction QD-sensitized PV cell 10 according to the present invention. As shown, cell 10 comprises a stacked layer structure including, in sequence: a (preferably transparent) substrate 1, an adhesion/seed layer 2A/2B, an electron conductive layer 3, an active PV layer 4, a hole conductive layer 5, and a (preferably transparent) electrode 6. Electrical contacts 7 and 8 to the electron conductive and electrode layers 3 and 6, respectively, provide electrical outputs for connection to a load device 9.

An illustrative, but non-limitative, sequence of process steps for fabricating cell 10 via PVD processing, e.g., co-sputtering, is described in detail in the following:

In an initial step, a substrate 1 is provided, comprising a material selected from the group consisting of glass, metals, alloys, polymers, ceramics, and composites and laminates thereof, with glass or other transparent material being preferred for facilitating irradiation of the active PV layer. A thin adhesion layer 2A, i.e., ~2 nm thick, of at least one material selected from the group consisting of Ti, Ta, CrTa, and CrTi is formed on the surface of the substrate 1, it generally being advantageous to form the adhesion layer 2A under deposition conditions yielding a smooth finished surface, e.g., a regime utilizing a low pressure sputtering atmosphere, such as from about 1 to about 5 mTorr Ar, Kr, or Xe. A seed layer 2B from about 1 to about 5 nm thick and comprising at least one material selected from the group consisting of Al, Au, Ag, Pt, Pd, Cu, Ni, Rh, Ru, Co, Re, and Ti is then formed under similar conditions in overlying contact with the adhesion layer 2A. The seed layer 2B functions to provide a desired crystallographic texture and adequate lattice match to subsequently deposited overlying layers. Suitable alternative materials for the seed layer 2B include alloy compositions primarily comprising fcc or hcp metals with additions of other fcc or hcp metals or even bcc materials. A preferred adhesion layer/seed layer 2A/2B combination is Ti/Au.

In the next step according to the inventive methodology, a first electrode 3 comprised of a transparent electrically conductive material, e.g., a transparent conductive oxide ("TCO") such as $SnO_2$:F, ZnO, $SrRuO_3$, $In_2O_3$—$SnO_2$ ("ITO"), and $CdSnO_4$, is formed on the adhesion layer/seed layer 2A/2B in a 2-stage sputtering process. A low pressure sputtering atmosphere, e.g., from about 1 to about 10 mTorr, is utilized in the first stage for deposition of the initial 2-90 nm thickness of the TCO, and a higher pressure sputtering atmosphere, e.g., from about 10 to about 200 mTorr, is utilized in the second stage for deposition of the final 1-10 nm thickness of the TCO. The 2-stage sputtering process creates a granular, nano-textured TCO surface necessary for achieving 2-12 nm separation of the subsequently deposited QD columns or grains in the overlying active PV layer.

Figure 6:
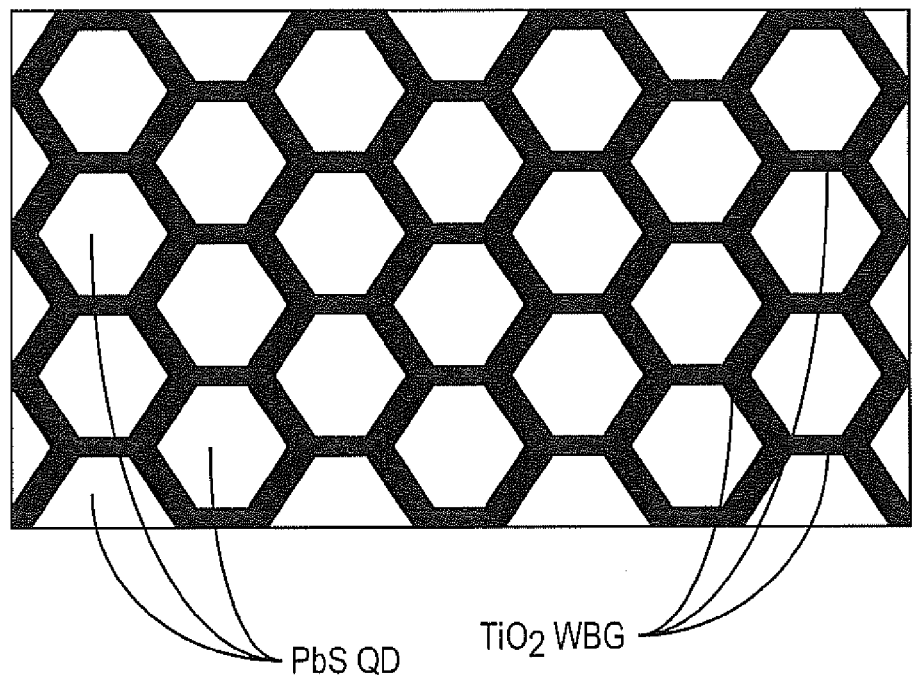
FIG. 6 is a simplified, schematic plan view of 2-dimensional honeycomb-type structure of the active PV layer of QD-sensitized PV cells according to the present invention.
Figure 7:
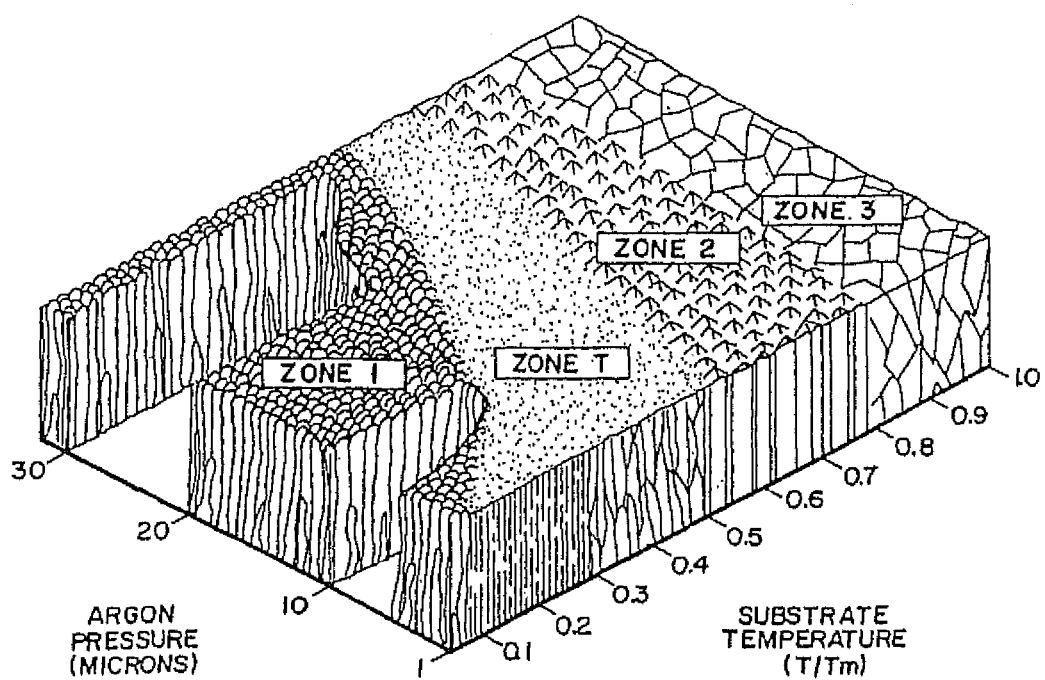
FIG. 7 is a Thornton-type diagram illustrating various crystallographic structures/morphologies of films obtainable as a function of deposition parameters.

According to the next step of the inventive methodology, the active PV layer 4 comprised of a WBG semiconductor material (i.e., ≥2.0 eV, preferably ≥3.0 eV), and a narrower bandgap QD semiconductor material (i.e., <2.0 eV, preferably <1.0 eV) is deposited on the granular, nano-textured surface of the TCO layer 3 via a PVD process, preferably a co-sputter deposition process utilizing separate targets or targets comprised of mixtures or segments of each material, and DC, AC, or RF plasma generation. Depending upon the electrical characteristics of the particular targets employed for the co-deposition process, DC- or RF-magnetron or DC- or RF-diode cathodes may be utilized. Suitable materials for use as the WBG semiconductor include electron conductive materials such as $TiO_2$, ZnS, ZnO, $Ta_2O_5$, $Nb_2O_5$, and $SnO_2$, with anatase $TiO_2$ being preferred; and suitable materials for use as the QD material include PbS, InP, InAs, CdS, CdSe, CdTe, $Bi_2S_3$, and AlSb, with PbS being preferred. The QD material is co-deposited with the immiscible WBG material, such that the QD material nucleates at the peaks of the TCO layer 3 and forms columns (or grains) extending substantially orthogonally therefrom, whereas the WBG material migrates to and segregates at the boundaries between adjacent columns (grains) of QD material to form a 2-dimensional matrix, as for example, the substantially honeycomb-shaped matrix schematically shown in plan view in FIG. 6, in which the QD material fills the spaces of the 2-dimensional matrix formed by the WBG semiconductor material and establishes a heterojunction therewith.

The sputter deposition parameters utilized for the co-deposition process are similar to the deposition parameters utilized for the second deposition phase of the TCO layer 3 (described supra), and are similar to those utilized for forming the sharply separated columnar grains in Zone 1 of a Thornton diagram (see, e.g., *J. Vac. Sci. Technol.* 11, 666-670 (1974) or U.S. Pat. No. 4,557,981). In contrast with QD-WBG active layers produced by conventional methodologies, an active PV layer 4 comprising a 2-dimensional matrix of QD material with WBG material as a grain boundary segregant is formed according to the invention, wherein the QD material constitutes a substantially increased portion of the volume of the active PV layer 4, i.e., from about 40 to about 90 vol. % of the resultant film, typically about 70 vol. %.

Process conditions typical of Zone 1 of the Thornton diagram include low to moderate substrate temperature, e.g., <40% homologous temperature (defined as $T_{substrate}/T_{melting}$), preferably about 200° C., and relatively high sputter gas pressures >20 mTorr of inert gas (e.g., Ar), preferably >30 mTorr. This combination of process parameters yields thin films with columnar (or granular) grain structures with varying amounts of porosity between neighboring grains, and is ideal for facilitating segregation of immiscible materials, since the columnar grain structures form the QD's while the immiscible WBG material is accumulated/trapped at the porous grain boundaries. The resultant structure may resemble a honeycomb when viewed in plan view (as in FIG. 6), where the WBG semiconductor material forms a 2-dimensional, substantially honeycomb-shaped matrix or lattice and the QD semiconductor material (shaded in the figure) occupies the spaces defined by the matrix or lattice.

The particles (columns) of QD material are well isolated, with dimensions in the nm range, consistent with the requirements for quantum confinement. Also in contrast with conventional QD-WBG active layer materials and QD-WBG PV cells, the columnar-shaped grains extend for substantially the entire thickness of the active PV layer 4, and contact the electron conductive layer 3 and the subsequently formed hole conductive layer 5.

Proper adjustment of the constituent stoichiometries of the WBG matrix (segregant) material, e.g., Ti and $O_2$ of $TiO_2$, and QD columnar material, e.g., Pb and S of PbS, may require addition of gases such as $H_2S$ and/or $O_2$ during the co-deposition process. Anatase $TiO_2$ is a preferable matrix material (segregant) in view of its ability to accept charge injection from the neighboring QD material at the grain boundaries. In addition, it is immiscible in the material of the QD, e.g., PbS, and therefore drifts along the growing surfaces of the QD columns or grains until captured in the physically recessed regions of the grain boundaries. Simultaneously, the QD semiconductor material forms an epitaxial interface with the TCO layer 3, e.g., ITO. The co-deposition process therefore leads to isolated QD semiconductor columns or grains with physical dimension consistent with obtaining/exhibiting quantum confinement effects, i.e., from about 2 to about 10 nm. A log-normal distribution of grain diameters, d, occurs, and with optimization of co-deposition parameters $\sigma_d/d$ is less than ~20%. Suitable thicknesses of the QD-WBG active PV layer according to the invention range from about 2 to about 20 nm, with from about 2 to about 10 nm preferred.

In the next step according to the inventive methodology, a hole conductive semiconductor layer 5 is deposited on the active PV layer 4 via a sputtering process performed under conditions similar to those utilized for deposition of the seed layer 2B. In this regard, inorganic semiconductor (SC) materials wherein $(\Phi_A\text{-VB})_{SC} > (\Phi_A\text{-VB})_{QD}$, e.g., Si, p-Si, GaAs, or p-GaAs, are preferred, inasmuch as they are capable of accepting holes from the QD (absorber) as well as injecting electrons from the contact back into the QD. The hole conductor layer 5 is from about 1 to about 20 nm thick and is optimized for maximum hole conductivity and minimum electron tunneling current. The thickness of the hole conductor layer is desirably minimized in order to achieve transparency, thereby facilitating exposure of either side of the device to light and use as an electricity generating window covering.

An electrode layer 6 is then formed over the hole conductor layer, and may comprise a relatively thin metal layer, i.e., from about 2 to about 20 nm thick and comprised of, e.g., Hf, Au, Ni, Al, Cu, Pt, or Pd, or a relatively thick TCO layer, i.e., from about 10 to about 100 nm thick, and comprised of ITO. Process conditions for forming the second electrode layer 6 are not critical, and the latter may, if desired or necessary for protection from deleterious environmental effects, be covered with a relatively thick, impervious layer of a transparent glass or polymeric material.

Finally, respective electrical output contacts 7 and 8 are affixed to the electron conductive layer 3 and electrode layer 6 in conventional manner in order to obtain electrical output from the cell for supply to a load 9.

Figure 8A:
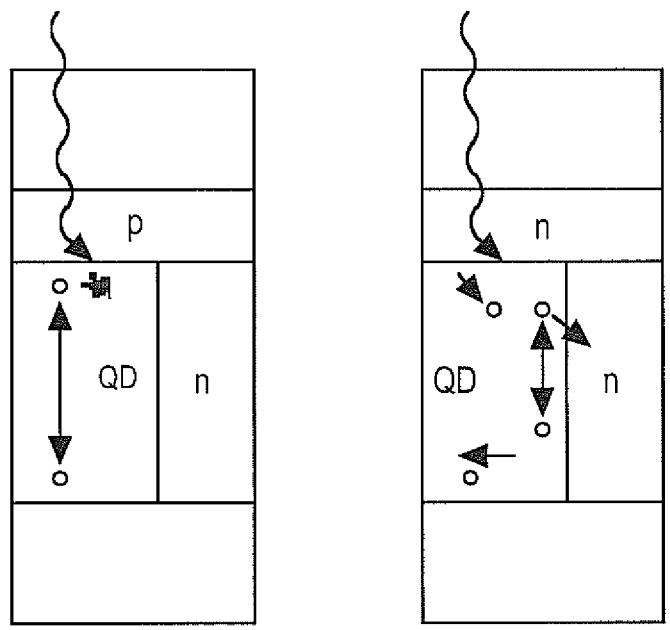
FIGS. 8 (A) and 8 (B) schematically illustrate the impact ionization/inverse Auger process and 2-sided irradiation capability of QD-sensitized PV cells according to the present invention.
Figure 8B:
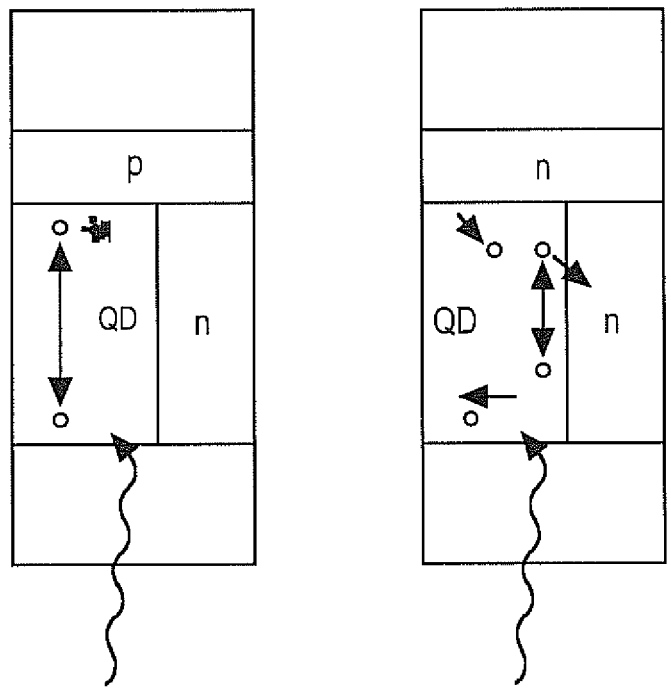

An advantage of the present invention is the ability to fabricate cells from optically transparent substrate, adhesion/seed layer, electron conductor, and electrode materials, whereby irradiation of either or both sides is possible. Referring to FIGS. 8(A) and 8(B), schematically illustrated therein are the impact ionization/inverse Auger recombination process and 2-sided irradiation capability of solid-state heterojunction QD-sensitized PV cells according to the present invention.

The present invention therefore advantageously provides improved, high photon conversion efficiency, solid-state heterojunction, quantum dot-sensitized wide bandgap (QD-WBG) photovoltaic (PV) devices which avoid the above-described limitations imposed on the quantum (photon conversion) efficiency of prior QD-WBG devices fabricated according to conventional methodologies. The QD-WBG PV devices of the present invention are especially useful when utilized as solar cells for the direct conversion of solar radiation to electricity. Further, QD-WBG PV devices according to the present invention can be fabricated in cost-effective manner utilizing well-known PVD techniques such as sputter deposition.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method comprising:
   (a) providing an electron conductive layer;
   (b) forming an active photovoltaic (PV) layer in contact with said electron conductive layer by co-sputter deposition;
   (c) forming a hole conductive layer in contact with said active PV layer; and
   (d) forming an electrode layer in contact with said hole conductive layer,
   wherein said (b) comprises:
      (i) providing a wide bandgap (WBG) semiconductor material with $E_g \geq 2.0$ eV;
      (ii) providing a narrower bandgap semiconductor material with $E_g < 2.0$ eV;
      (iii) forming a 2-dimensional matrix comprising said WBG semiconductor material; and
      (iv) filling said matrix with about hexagonal quantum dots (QDs) of said narrower bandgap semiconductor material in a close-packed array,
   wherein:
      said narrower bandgap and WBG semiconductor materials form a heterojunction therebetween;
      said QDs are isolated by said WBG semiconductor material; and
      each QD extends from said electron conductive layer to said hole conductive layer.

2. The method according to claim 1, wherein:
said (b)(iii) and (b)(iv) are performed about simultaneously by co-sputter deposition of said narrower bandgap and WBG semiconductor materials.

3. The method according to claim 2, wherein:
said (b)(iii) and (b)(iv) are performed according to conditions typical of Zone 1 of a Thornton diagram and include low to moderate substrate temperatures of about 200° C. and relatively high sputter gas pressures >20 mTorr of inert gas.

4. The method according to claim 2, wherein:
said (b)(iii) and (b)(iv) further comprise adjusting constituent stoichiometry of said WBG or narrower bandgap semiconductor material by adjusting a gas comprising a constituent of said WBG or narrower bandgap semiconductor material.

5. The method according to claim 1, wherein:
said QDs constitute from about 40 to about 90 vol. % of said active PV layer formed in said (b).

6. The method according to claim 1, wherein:
said QDs constitute about 70 to about 90 vol. % of said active PV layer formed in said (b).

7. The method according to claim 1, wherein:
said (b)(i) and (b)(ii) comprise providing immiscible WBG and narrower bandgap semiconductor materials; and
said (b)(iii) and (b)(iv) form one of said columnar or grain-shaped QDs.

8. The method according to claim 7, wherein:
said one of said columnar or grain-shaped QDs formed in said (b)(iii) and (b)(iv) has a physical dimension within a range from about 2 to about 10 nm for exhibiting quantum containment effects.

9. The method according to claim 1, wherein:
said (b)(i) comprises providing said WBG semiconductor material as an electron conductive material selected from the group consisting of: $TiO_2$, $ZnS$, $ZnO$, $Ta_2O_5$, $Nb_2O_5$, and $SnO_2$; and
said (b)(ii) comprises providing said narrower bandgap semiconductor material selected from the group consisting of: $PbS$, $InP$, $InAs$, $CdS$, $CdSe$, $CdTe$, $Bi_2S_3$, and $AlSb$.

10. The method according to claim 9, wherein:
said (b)(i) comprises providing a WBG semiconductor material having a bandgap $E_g > 3.0$ eV; and
said (b)(ii) comprises providing a narrower bandgap semiconductor material having a bandgap $E_g < 1.0$ eV.

11. The method according to claim 9, wherein:
said (b)(i) comprises providing anatase $TiO_2$ as said WBG semiconductor material; and
said (b)(ii) comprises providing PbS as said narrower bandgap semiconductor material.

12. The method according to claim 1, wherein:
said electron conductive layer formed in said (a) comprises sputtering at an initial pressure of about 1 to about 10 mTorr for deposition of an initial 2-90 nm of said electron conductive layer and at a subsequent pressure of about 10 to about 200 mTorr for deposition of a subsequent 1-10 nm of said electron conductive layer;
said electron conductive layer comprises $SnO_2$:F, ZnO, $SrRuO_3$, $In_2O_3$—$SnO_2$, or $CdSnO_4$; and said electron conductive layer is sufficiently transparent for irradiation of said active PV layer.

13. The method according to claim 12, wherein:
said active PV layer formed in said (b)(iii) and said (b)(iv) is from about 2 to about 20 nm thick.

14. The method according to claim 13, wherein:
said hole conductive layer formed in said (c) is from about 1 to about 20 nm thick;
said hole layer comprises Si, p-Si, GaAs, or p-GaAs; and
said hole conductive layer is sufficiently transparent for irradiation of said active PV layer.

15. The method according to claim 14,
wherein said electrode layer formed in said (d) is from about 2 to about 20 nm thick,
wherein said electrode layer comprises Hf, Au, Ni, Al, Cu, Pt, or Pd, and
wherein said electrode layer is sufficiently transparent for irradiation of said active PV layer.

16. The method according to claim 14,
wherein said electrode layer formed in said (d) is from about 10 nm to about 100 nm thick,
wherein said electrode layer comprises $In_2O_3$—$SnO_2$, and
wherein said electrode layer is sufficiently transparent for irradiation of said active PV layer.

17. The method according to claim 1, wherein:
said (a) comprises providing a transparent n-type semiconductor layer formed over a surface of a transparent substrate, said transparent n-type semiconductor layer comprising a layer of a transparent conductive oxide (TCO) material selected from the group consisting of: $SnO_2$:F, ZnO, $SrRuO_3$, $In_2O_3$—$SnO_2$ (ITO), and $CdSnO_4$.

18. The method of claim 1,
wherein said (a) comprises:
(i) forming at least one of an adhesion layer or a seed layer in a low-pressure atmosphere to provide a smooth surface; and
(ii) depositing said electron conductive layer over said at least one of said adhesion layer or said seed layer, wherein:
an initial layer of said electron conductive layer is deposited using a first sputtering atmosphere, and
a subsequent layer of said electron conductive layer is deposited using a second sputtering atmosphere of a higher pressure than said first sputtering atmosphere.

19. The method of claim 18, wherein a portion of each of said QDs is in contact with a surface of said electron conductive layer that causes a separation of less than 12 nm among each of said QDs.

20. A method comprising:
forming a two-dimensional matrix comprising a wide bandgap (WBG) semiconductor material,
wherein said matrix defines an array of close-packed open spaces; and
filling said open spaces with about hexagonal quantum dots (QDs) of a narrower bandgap semiconductor material by co-sputtering said narrower bandgap semiconductor material with said WBG material,
wherein said narrower bandgap and WBG semiconductor materials form a heterojunction therebetween, and
wherein each QD extends from an underlying electron conductive layer to an overlying hole conductive layer.

21. The method according to claim 20,
wherein said WBG semiconductor material is selected form $TiO_2$, ZnS, ZnO, $Ta_2O5$, $Nb_2O_5$, and $SnO_2$, and wherein said narrower bandgap semiconductor material is selected from PbS, InP, InAs, CdS, CdSe, CdTe, $Bi_2S_3$, and AlSb.

22. The method according to claim 21 further comprising:
forming an electron conductive layer,
wherein an active PV layer comprising said two-dimensional matrix is in contact with said electron conductive layer;
forming a hole conductive layer in contact with said electron conductive layer; and
forming an electrode layer in contact with said hole conductive layer.

23. The method according to claim 22 further comprising:
prior to providing said electron conductive layer, providing adhesion and seed layers,
wherein said adhesion layer comprises at least one material selected from the group consisting of: Ti, Ta, CrTa, and CrTi, and
wherein said seed layer comprises at least one material selected from the group consisting of: Al, Au, Ag, Pt, Pd, Cu, Ni, Rh, Ru, Co, Re, and Ti.

24. The method according to claim 22,
wherein said electron conductive layer is formed by means of 2-stage sputter deposition comprising a first stage utilizing a low pressure sputtering atmosphere for deposition of an initial electron conductive layer, and a second stage utilizing a higher pressure sputtering atmosphere for deposition of a final electron conductive layer.

25. The method of claim 20, further comprising:
forming at least one of an adhesion layer or a seed layer in a low-pressure atmosphere to provide a smooth surface; and
depositing said electron conductive layer over said at least one of said adhesion layer or said seed layer,
wherein:
an initial layer of said electron conductive layer is deposited using a first sputtering atmosphere, and
a subsequent layer of said electron conductive layer is deposited using a second sputtering atmosphere of a higher pressure than said first sputtering atmosphere.

26. The method of claim 25, wherein a portion of each of said QDs is in contact with a surface of said electron conductive layer that causes a separation of less than 12 nm among each of said QDs.

27. A method comprising:
forming an electron conductive layer;
epitaxially forming an active photovoltaic (PV) layer in contact with said electron conductive layer by co-sputter deposition, wherein forming said active PV layer comprises:
forming a heterojunction of a 2-dimensional matrix of a wide bandgap (WBG) semiconductor material and about hexagonal quantum dots (QDs) of a narrower bandgap semiconductor material in a close-packed array therein at about 40 to about 90 vol %,
wherein each QD extends from said electron conductive layer to said hole conductive layer;
forming a hole conductive layer in contact with said active PV layer; and
forming an electrode layer in contact with said hole conductive layer.

28. The method according to claim 27,
wherein said hole conductive layer comprises Si, p-Si, GaAs, or p-GaAs, and
wherein said hole conductive layer is of a thickness sufficiently transparent for irradiation of said active PV layer.

29. The method according to claim 27,
wherein said electrode layer comprises Hf, Au, Ni, Al, Cu, Pt, Pd, or $In_2O_3$—$SnO_2$, and
wherein said electrode layer is of a thickness sufficiently transparent for irradiation of said active PV layer.

30. The method according to claim 27,
wherein said electron conductive layer comprises $SnO_2$:F, ZnO, $SrRuO_3$, $In_2O_3$—$SnO_2$, or $CdSnO_4$; and
wherein said electron conductive layer is of a thickness sufficiently transparent for irradiation of said active PV layer.

31. The method according to claim 27,
wherein said QDs constitute about 90 vol. % of said matrix.

32. The method of claim 27, further comprising:
forming at least one of an adhesion layer or a seed layer in a low-pressure atmosphere to provide a smooth surface; and
depositing said electron conductive layer over said at least one of said adhesion layer or said seed layer,
wherein:
an initial layer of said electron conductive layer is deposited using a first sputtering atmosphere, and
a subsequent layer of said electron conductive layer is deposited using a second sputtering atmosphere of a higher pressure than said first sputtering atmosphere.

33. The method of claim 32, wherein a portion of each of said QDs is in contact with a surface of said electron conductive layer that causes a separation of less than 12 nm among each of said QDs.

34. A method comprising:
forming an electron conductive layer with a granular nano-textured surface by depositing an initial electron conductive layer using a first sputtering atmosphere and depositing a final electron conductive layer using a second sputtering atmosphere that has a higher pressure in comparison to said first sputtering atmosphere;
epitaxially forming an active photovoltaic (PV) layer in contact with said electron conductive layer by co-sputter deposition, wherein forming said active PV layer comprises:
forming a 2-dimensional matrix comprising a wide bandgap (WBG) semiconductor material and about hexagonal quantum dots (QDs) of a narrower bandgap semiconductor material in a close-packed array therein at about 70 to about 90 vol %,
wherein said narrower bandgap and WBG semiconductor materials form a heterojunction therebetween;
forming a hole conductive layer in contact with said active PV layer; and
forming an electrode layer in contact with said hole conductive layer.

35. The method of claim 34, further comprising:
forming at least one of an adhesion layer or a seed layer in a low-pressure atmosphere to provide a smooth surface; and
depositing said electron conductive layer over said at least one of said adhesion layer or said seed layer.

36. The method of claim 35, wherein a portion of each of said QDs is in contact with a surface of said electron conductive layer that causes a separation of less than 12 nm among each of said QDs.

* * * * *